(12) United States Patent
Kosaka et al.

(10) Patent No.: US 10,678,125 B2
(45) Date of Patent: Jun. 9, 2020

(54) PHOTOMASK BLANK AND METHOD FOR PREPARING PHOTOMASK

(71) Applicant: Shin-Etsu Chemical Co., Ltd., Tokyo (JP)

(72) Inventors: Takuro Kosaka, Joetsu (JP); Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 77 days.

(21) Appl. No.: 15/436,128

(22) Filed: Feb. 17, 2017

(65) Prior Publication Data
US 2017/0255095 A1  Sep. 7, 2017

(30) Foreign Application Priority Data

Mar. 2, 2016  (JP) .................................. 2016-040199
Dec. 20, 2016  (JP) .................................. 2016-246173

(51) Int. Cl.
| | | |
|---|---|---|
| G03F 1/22 | (2012.01) | |
| G03F 1/58 | (2012.01) | |
| G03F 1/54 | (2012.01) | |
| G03F 1/26 | (2012.01) | |
| G03F 1/80 | (2012.01) | |
| H01L 21/027 | (2006.01) | |

(52) U.S. Cl.
CPC .................. *G03F 1/22* (2013.01); *G03F 1/26* (2013.01); *G03F 1/54* (2013.01); *G03F 1/58* (2013.01); *G03F 1/80* (2013.01); *H01L 21/0273* (2013.01)

(58) Field of Classification Search
CPC ..... G03F 1/22; G03F 1/26; G03F 1/80; G03F 1/54; G03F 1/58; H01L 21/0273; H01L 21/027
See application file for complete search history.

(56) References Cited

U.S. PATENT DOCUMENTS

| | | | |
|---|---|---|---|
| 6,030,729 A | 2/2000 | Ito et al. | |
| 6,743,553 B2 * | 6/2004 | Shiota ....................... | G03F 1/32 430/311 |
| 9,366,951 B2 * | 6/2016 | Inazuki ..................... | G03F 1/26 |
| 9,645,485 B2 * | 5/2017 | Kosaka ..................... | G03F 1/32 |

(Continued)

FOREIGN PATENT DOCUMENTS

| | | |
|---|---|---|
| EP | 2871520 A2 | 5/2015 |
| JP | 59-139033 A | 9/1984 |

(Continued)

OTHER PUBLICATIONS

Cheiu et al., "Si-N Attenuated phase shift layer for phase shift mask application", IBM Tech. Discl. Bul, vol. 35(3) pp. 440-441 (Aug. 1992).*

(Continued)

*Primary Examiner* — Martin J Angebranndt

(74) *Attorney, Agent, or Firm* — Birch, Stewart, Kolasch & Birch, LLP

(57) ABSTRACT

A photomask blank comprising a transparent substrate and a light-shielding film disposed thereon is provided. The light-shielding film is constructed by a single layer or multiple layers including a light-shielding layer containing Si and N, having a N content of 3-50 at % based on the sum of Si and N, being free of a transition metal.

20 Claims, 4 Drawing Sheets

(56) References Cited

U.S. PATENT DOCUMENTS

| | | | |
|---|---|---|---|
| 9,927,695 B2* | 3/2018 | Kosaka | G03F 1/32 |
| 2004/0063001 A1 | 4/2004 | Wu et al. | |
| 2008/0041716 A1* | 2/2008 | Alpay | C23C 14/0084 |
| | | | 204/192.2 |
| 2015/0125785 A1* | 5/2015 | Inazuki | G03F 1/26 |
| | | | 430/5 |
| 2015/0160549 A1* | 6/2015 | Sasamoto | G03F 1/26 |
| | | | 430/5 |
| 2015/0338731 A1* | 11/2015 | Nozawa | G03F 1/32 |
| | | | 430/5 |
| 2016/0291453 A1* | 10/2016 | Inazuki | G03F 1/32 |
| 2016/0291455 A1* | 10/2016 | Kosaka | G03F 1/26 |
| 2017/0212417 A1* | 7/2017 | Kosaka | G03F 1/32 |
| 2018/0059532 A1* | 3/2018 | Inazuki | G03F 1/32 |

FOREIGN PATENT DOCUMENTS

| | | | | | |
|---|---|---|---|---|---|
| JP | 10-004885 | * | 2/1998 | | G03F 1/08 |
| JP | 10-319569 A | | 12/1998 | | |
| JP | 2009-122566 A | | 6/2009 | | |
| JP | 2014-137388 | * | 7/2014 | | G03F 1/32 |
| JP | 2014-191176 A | | 10/2014 | | |
| JP | 2016-018192 | * | 2/2016 | | G03F 1/32 |

OTHER PUBLICATIONS

Extended European Search Report, dated Jul. 27, 2017, for European Application No. 17157220.9.
Japanese Office Action for Japanese Application No. 2016-246173, dated Sep. 24, 2019.

* cited by examiner

PHOTOMASK BLANK AND METHOD FOR PREPARING PHOTOMASK

CROSS-REFERENCE TO RELATED APPLICATION

This non-provisional application claims priority under 35 U.S.C. § 119(a) on Patent Application Nos. 2016-040199 and 2016-246173 filed in Japan on Mar. 2, 2016 and Dec. 20, 2016, respectively, the entire contents of which are hereby incorporated by reference.

TECHNICAL FIELD

This invention relates to a photomask blank which is processed into a photomask for use in the manufacture of semiconductor integrated circuits or the like, and a method for preparing a photomask.

BACKGROUND ART

While semiconductor integrated circuits are used in a variety of applications, a finer circuit design is demanded in order to increase an integration density and save power consumption. On the side of lithography technology using a photomask for circuit formation, the development of miniaturization technology is promoted from 45 nm node to 32 nm node and further to 20 nm node or less. To print images of finer size, a light source of shorter wavelength is used for exposure. In the current advanced commercial process, the light source has made a transition from KrF excimer laser light (248 nm) to ArF excimer laser light (193 nm). To print images of finer size, the super-resolution technology is advancing. For example, immersion lithography, modified illumination and supplement patterns are used. As to the photomask used in photolithography, there are developed not only binary photomasks consisting of a light transmitting section and a light-shielding section, but also phase shift photomasks utilizing optical interference including halftone phase shift masks, Levenson phase shift masks, and chromeless phase shift masks The photomask blank which is a precursor to a photomask basically has the structure that inorganic films such as a light-shielding film for shielding exposure light and a phase shift film for changing the phase of exposure light are formed on a transparent substrate which is transmissive to exposure light. The photomask is prepared from the photomask blank by patterning the inorganic films such as light-shielding film and phase shift film thereon. As the inorganic film, for example, light-shielding film, a chromium base film containing chromium or a molybdenum silicon base film containing molybdenum and silicon is often used. Besides, a film of silicon alone is also known as a film capable of reducing EMF bias caused by electromagnetic field (EMF) effect.

CITATION LIST

Patent Document 1: JP-A 2014-191176
Patent Document 2: JP-B S59-139033

SUMMARY OF INVENTION

The light-shielding film should have a thickness enough to provide a predetermined degree of light shielding. Where the light-shielding film is a silicon-containing film, it is important for finer size processing to reduce the thickness of light-shielding film, to insure ease of working, and to increase the etching rate. As the etching rate is increased, for example, the thickness of a resist film used for pattern formation can be reduced. Even when a hard mask film is formed on the light-shielding film, the thickness of the hard mask film can be reduced, and this, in turn, enables to reduce the thickness of a resist film used for processing the hard mask film. Thus, a silicon-containing film which is more easily workable in pattern formation is required.

An object of the invention is to provide a photomask blank having a silicon-containing light-shielding film which is thin and effectively workable, and a method for preparing a photomask from the photomask blank.

Regarding a photomask blank comprising a transparent substrate and a light-shielding film disposed thereon, the inventors have found that better results are obtained when the light-shielding film is a film containing silicon and nitrogen, but being free of a transition metal, and the light-shielding film is constructed by a single layer or multiple layers including a light-shielding layer containing silicon and nitrogen, free of a transition metal, and having a nitrogen content of 3 to 50 at % based on the sum of silicon and nitrogen. Then the light-shielding film is thin and has an increased etching rate which contributes to ease of working.

In one aspect, the invention provides a photomask blank comprising a transparent substrate and a light-shielding film disposed thereon, containing silicon and nitrogen, but being free of a transition metal. The light-shielding film is constructed by a single layer or multiple layers, and the single layer or one of the multiple layers is a light-shielding layer containing silicon and nitrogen, free of a transition metal, and having a nitrogen content of 3 to 50 at % based on the sum of silicon and nitrogen.

Preferably the light-shielding layer consists of silicon and nitrogen.

In one preferred embodiment, the light-shielding film is constructed by a single layer which is the light-shielding layer.

In another preferred embodiment, the light-shielding film is constructed by multiple layers which are the light-shielding layer and a reflectance-reducing layer containing silicon and nitrogen, free of a transition metal. Preferably the silicon content of the reflectance-reducing layer is lower than the silicon content of the light-shielding layer, and the reflectance-reducing layer has a silicon content of 43 to 60 at % and a nitrogen content of 40 to 57 at %. Typically, the reflectance-reducing layer has a thickness of up to 30 nm.

In a further preferred embodiment, the light-shielding film is constructed by multiple layers which are the light-shielding layer and a compositionally graded layer containing silicon and nitrogen, free of a transition metal, having a composition continuously graded in thickness direction. Preferably, the compositionally graded layer has a thickness of up to 30 nm. Also preferably, the compositionally graded layer is a reflectance-reducing layer which is disposed on the side of the light-shielding layer remote from the substrate and compositionally graded such that the silicon content continuously decreases in a direction remote from the substrate. Typically, the reflectance-reducing layer has a silicon content of 43 to 60 at % and a nitrogen content of 40 to 57 at % at the surface thereof which is remote from the substrate.

Preferably the light-shielding film has a thickness of up to 70 nm.

The photomask blank may further comprise: a hard mask film which is disposed contiguous to the surface of the light-shielding film remote from the substrate, and has different etching properties from the light-shielding film; an etching stop film which is disposed contiguous to the surface of the light-shielding film close to the substrate, and has different etching properties from the light-shielding film; or a phase shift film.

The photomask blank is typically intended for use with exposure light from ArF excimer laser.

Also provided is a method for preparing a photomask by using the photomask blank defined above.

Advantageous Effects of Invention

The photomask blank of the invention has a silicon-containing light-shielding film which is thin and effectively workable.

DESCRIPTION OF PREFERRED EMBODIMENTS

One embodiment of the invention is a photomask blank comprising a transparent substrate and a light-shielding film disposed thereon. The light-shielding film is formed of a material containing silicon and nitrogen, but being free of a transition metal. The light-shielding film is constructed by a single layer or multiple layers. The single layer or one of the multiple layers is a light-shielding layer containing silicon and nitrogen, free of a transition metal, and having a nitrogen content of 3 to 50 at % based on the sum of silicon and nitrogen. With this construction, the film may be reduced in thickness while maintaining a predetermined optical density (OD), and accelerated in etching rate. The film free of a transition metal is fully resistant to laser irradiation, so that a photomask may be prepared which experiences a minimal line width variation even when exposure light is irradiated in an accumulative exposure dose of at least 30 kJ/cm$^2$, especially at least 40 kJ/cm$^2$.

The transparent substrate is typically a quartz substrate which is transparent to the wavelength of commonly used exposure light although the type and size of the substrate are not particularly limited. Preference is given to transparent substrates of 6 inch squares and 25 mil thick, known as 6025 substrate, as prescribed in the SEMI standards, or transparent substrates of 152 mm squares and 6.35 mm thick when expressed in the SI units.

In the photomask blank, the light-shielding layer included in the light-shielding film has a nitrogen content of preferably at least 5 at %, more preferably at least 10 at %, even more preferably at least 13 at %, and preferably up to 45 at %, more preferably up to 40 at %, even more preferably up to 35 at % based on the sum of silicon and nitrogen. Preferably the light-shielding film consists of silicon and nitrogen, that is, a SiN film. The light-shielding layer which is the single layer or one of the multiple layers of the light-shielding film should preferably have a total content of silicon and nitrogen which is at least 70 at %, more preferably at least 80 at %, and even more preferably at least 90 at % based on the layer and most preferably consist of silicon and nitrogen, that is, a SiN layer.

Figure 1:
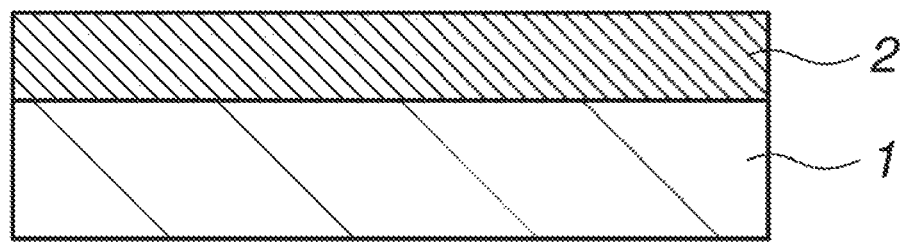
FIG. 1 is a cross-sectional view of a photomask blank in one embodiment of the invention.

In one embodiment, the light-shielding film is a single layer. One exemplary photomask blank having a monolayer light-shielding film is illustrated in FIG. 1 as comprising a monolayer light-shielding film 2 formed on a transparent substrate 1. In the embodiment wherein the light-shielding film is a single layer, it is constructed by a single light-shielding layer. The light-shielding film of monolayer structure ensures that a pattern of satisfactory profile is formed. If the light-shielding film is composed of silicon alone, then it has a high reflectance. In this case, a reflectance-reducing layer having a low level of light shielding must be provided in order to reduce reflectance. In the photomask blank of the invention, however, the reflectance of the light-shielding film with respect to exposure light may be made lower by increasing the nitrogen content of the light-shielding film, even when the light-shielding film is a single layer. Particularly when the light-shielding layer (i.e., light-shielding film) is formed of an oxygen-free material, especially a material consisting of silicon and nitrogen (i.e., SiN), there is obtained the advantage that the light-shielding film can be further reduced in thickness.

In another embodiment, the light-shielding film is constructed by multiple layers (i.e., two, three or more layers). Where the light-shielding film is of multilayer structure, for example, a reflectance-reducing layer containing silicon and nitrogen, but free of a transition metal may be included in addition to the light-shielding layer. Preferably the light-shielding film consists of the light-shielding layer and the reflectance-reducing layer.

Figure 2:
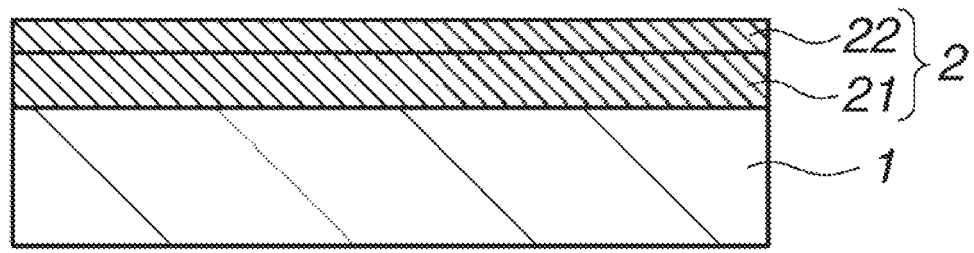
FIG. 2 is a cross-sectional view of a photomask blank in another embodiment of the invention.

One exemplary photomask blank having a bilayer light-shielding film consisting of a light-shielding layer and a reflectance-reducing layer is illustrated in FIG. 2 as comprising a transparent substrate 1 and a light-shielding film 2 consisting of a light-shielding layer 21 and a reflectance reducing layer 22 which are disposed on the substrate 1 in the described order. Though not shown, a reflectance-reducing layer may be disposed on the (lower) side of the light-shielding layer 21 close to the substrate 1. Also the light-shielding film may include an adhesion improving layer on the (lower) side of the light-shielding layer 21 close to the substrate 1.

Preferably the silicon content of the reflectance-reducing layer is lower than the silicon content of the light-shielding layer. Also preferably the reflectance-reducing layer has a silicon content of 43 to 60 at % and a nitrogen content of 40 to 57 at %. Although the reflectance-reducing layer may contain oxygen, it is preferred that both the light-shielding layer and the reflectance-reducing layer be formed of oxygen-free materials, especially materials consisting of silicon and nitrogen (i.e., SiN), because the light-shielding film can be reduced in thickness. The thickness of the reflectance-reducing layer is preferably up to 40%, more preferably up to 30% of the total thickness of the light-shielding film. Specifically the reflectance-reducing layer has a thickness of up to 30 nm, more preferably up to 20 nm, and even more preferably up to 10 nm, because the light-shielding film can be reduced in overall thickness. Typically the thickness of the reflectance-reducing layer may be at least 2 nm.

It is preferred that the compositional difference between the light-shielding layer and another layer included in the multilayer light-shielding film be smaller, because steps are otherwise formed between the layers by etching. Specifically the light-shielding layer and the other layer included in the multilayer light-shielding film are preferably a combination of the light-shielding layer and a compositionally graded layer containing silicon and nitrogen, free of a transition metal, having a composition continuously graded in thickness direction. The term "compositionally graded" refers to a composition (or content) that continuously increases or decreases in thickness direction or increases and decreases combinedly. The thickness of the compositionally graded layer is preferably up to 40%, more preferably up to 30% of the overall thickness of the light-shielding film. Specifically the thickness of the compositionally graded layer is preferably up to 30 nm, more preferably up to 20 nm, and even more preferably up to 10 nm, because the overall thickness of the light-shielding film can be reduced. Typically the thickness of the compositionally graded layer may be at least 2 nm.

In the photomask blank, the reflectance of the light-shielding film with respect to exposure light may be suppressed as low as 50% or less, especially 40% or less. Particularly for the purpose of reducing the reflectance of the light-shielding film, it is preferred that the reflectance-reducing layer be a compositionally graded layer which is disposed on the surface of the light-shielding layer remote from the transparent substrate, and has a silicon content continuously decreasing in a thickness direction remote from the substrate. It is more preferable from the standpoints of reflectance reduction and avoidance of step formation by etching that the reflectance-reducing layer have a silicon content of 43 to 60 at % and a nitrogen content of 40 to 57 at % on the surface thereof remote from the substrate.

The light-shielding film is desirably as thin as possible. Specifically the light-shielding film has a thickness of preferably up to 70 nm, more preferably up to 60 nm, and even more preferably up to 55 nm. Typically the thickness of the light-shielding film is at least 35 nm, preferably at least 40 nm.

Each of the layers containing silicon and nitrogen, but free of a transition metal which constitute the light-shielding film is preferably deposited by the sputtering method capable of forming a film of homogeneity in a simple way. Either DC sputtering or RF sputtering may be employed. The target and sputtering gas may be selected as appropriate depending on the arrangement and composition of layers. Suitable targets are silicon-containing targets including a silicon target (or Si target), a silicon nitride target, and a target containing silicon and silicon nitride. Of these, silicon base targets, for example, targets having a silicon content of at least 90 at % are preferred, the silicon target being most preferred. The content of nitrogen may be adjusted by using a nitrogen-containing gas as the reactive gas, and adjusting the flow rate of such gas during reactive sputtering. A suitable reactive gas is nitrogen gas ($N_2$ gas). In the sputtering gas, a rare gas such as helium, neon or argon gas may be used as the inert gas. The preferred inert gas is argon gas. The sputtering pressure is typically 0.01 to 10 Pa, preferably 0.03 to 0.1 Pa.

The photomask blank of the invention may be prepared by forming a light-shielding film on a transparent substrate. Once the light-shielding film is formed, it may be heat treated at a temperature which is higher than the temperature used in the pattern forming step during the manufacture of a photomask from the photomask blank, for example, at least 150° C. The heat treatment atmosphere may be either an inert gas atmosphere such as helium gas or argon gas or an oxygen-containing atmosphere such as oxygen gas atmosphere, or even vacuum.

The light-shielding film may include a surface oxidized layer as the outermost layer (surface side of the film remote from the substrate) in order to suppress any change in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, heating of a film at 300° C. or higher in an oxygen-containing atmosphere such as oxygen gas atmosphere by oven heating, lamp annealing or laser heating, and formation of oxidized film by sputtering. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment after deposition is preferred for forming a less defective layer.

The photomask blank is defined as having a light-shielding film on a transparent substrate. In one embodiment, only the light-shielding film is formed on the transparent substrate. In another embodiment, a hard mask film (or etching mask film) for processing the light-shielding film may be formed on the surface of the light-shielding film remote from the substrate, preferably contiguous to the light-shielding film. Inclusion of the hard mask film is preferred because it allows a thinner resist film to be formed and thus a finer pattern to be formed accurately.

The hard mask film may be a film having different etching properties from the light-shielding film, preferably a film which is resistant to fluorine base dry etching using fluorine base gas (applied to etching of silicon-containing material) and susceptible to chlorine base dry etching using oxygen-containing chlorine base gas (chlorine oxygen gas), and more preferably a film of chromium-containing material. The hard mask film may have a monolayer or multilayer structure. Examples of the chromium-containing material include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the hard mask film is of a chromium-containing material, it preferably has a chromium content of at least 30 at %, more preferably 35 at % and up to 100 at %, more preferably up to 99 at %, and even more preferably up to 90 at %. The chromium-containing material has an oxygen content of at least 0 at % and up to 60 at %, preferably up to 40 at %, a nitrogen content of at least 0 at % and up to 50 at %, preferably up to 40 at %, and a carbon content of at least 0 at % and up to 30 at %, preferably up to 20 at %. The total content of chromium, oxygen, nitrogen and carbon is preferably at least 95 at %, more preferably at least 99 at %, and especially 100 at %. The hard mask film typically has a thickness of 1 to 30 nm, preferably 2 to 20 nm. The hard mask film may be completely removed after a pattern of the light-shielding film is formed. Alternatively, the hard mask film may be left in part or in entirety after a pattern of the light-shielding film is formed, and then it functions as a supplementary light-shielding film or an electroconductive film.

In a further embodiment, an etching stop film may be formed on the surface of the light-shielding film close to the transparent substrate (i.e., between the substrate and the light-shielding film), preferably contiguous to the light-shielding film. Inclusion of the etching stop film is preferred because it allows for accurate control of etching. The etching stop film and the hard mask film may be used in combination. The etching stop film may also be utilized as an etching mask film relative to the underlying substrate or as an etching mask film relative to a phase shift film if any.

The etching stop film may be a film having different etching properties from the light-shielding film, preferably a film which is resistant to fluorine base dry etching using fluorine base gas (applied to etching of silicon-containing material) and susceptible to chlorine base dry etching using oxygen-containing chlorine base gas (chlorine oxygen gas), and more preferably a film of chromium-containing material. The etching stop film may have a monolayer or multilayer structure. Examples of the chromium-containing material include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the etching stop film is of a chromium-containing material, it preferably has a chromium content of at least 30 at %, more preferably 35 at % and up to 100 at %, more preferably up to 99 at %, and even more preferably up to 90 at %. The chromium-containing material has an oxygen content of at least 0 at % and up to 60 at %, preferably up to 55 at %, a nitrogen content of at least 0 at % and up to 50 at %, preferably up to 40 at %, and a carbon content of at least 0 at % and up to 30 at %, preferably up to 20 at %. The total content of chromium, oxygen, nitrogen and carbon is preferably at least 95 at %, more preferably at least 99 at %, and especially 100 at %. The etching stop film typically has a thickness of 1 to 20 nm, preferably 2 to 10 nm.

A film of chromium-containing material may be deposited by the reactive sputtering method using a target such as a chromium target or a chromium target having added thereto one or more of oxygen, nitrogen and carbon, and a sputtering gas including a rare gas (inert gas) such as helium, neon or argon gas, and a reactive gas selected in accordance with the desired composition of a film to be deposited from among oxygen-containing gas, nitrogen-containing gas and carbon-containing gas.

The photomask blank of the invention may further comprise a phase shift film, which is typically disposed between the transparent substrate and the light-shielding film. The photomask blank including a phase shift film may take various structures including a structure that a phase shift film and a light-shielding film are formed in sequence on a transparent substrate, a structure that a phase shift film, a light-shielding film, and a hard mask film are formed in sequence on a transparent substrate, a structure that a phase shift film, an etching stop film, and a light-shielding film are formed in sequence on a transparent substrate, and a structure that a phase shift film, an etching stop film, a light-shielding film, and a hard mask film are formed in sequence on a transparent substrate.

The phase shift film may be either a fully transmissive phase shift film or a halftone phase shift film (e.g., having a transmittance of 5 to 30%). The phase shift film is preferably susceptible to fluorine base dry etching, more preferably a film of silicon-containing material. The phase shift film may have a monolayer or multilayer structure. Examples of the silicon-containing material include silicon-containing compounds, for example, silicon-containing compounds containing silicon and at least one of oxygen and nitrogen, such as silicon oxide (SiO), silicon nitride (SiN) and silicon oxynitride (SiON), and transition metal silicon compounds, for example, transition metal silicon compounds containing a transition metal (Me), silicon and at least one of oxygen, nitrogen and carbon, such as transition metal silicon oxide (MeSiO), transition metal silicon nitride (MeSiN), transition metal silicon carbide (MeSiC), transition metal silicon oxynitride (MeSiON), transition metal silicon oxycarbide (MeSiOC), transition metal silicon nitride carbide (MeSiNC), and transition metal silicon oxide nitride carbide (MeSiONC). The transition metal (Me) is preferably at least one of titanium (Ti), vanadium (V), cobalt (Co), nickel (Ni), zirconium (Zr), niobium (Nb), molybdenum (Mo), hafnium (Hf), tantalum (Ta) and tungsten (W). Inter alia, molybdenum (Mo) is preferred from the standpoint of dry etching. The phase shift film has such a thickness as to provide a phase shift of generally 150 to 200°, preferably 170 to 190°, more preferably 175 to 185°, and most preferably approximately 180° with respect to exposure light on use of a photomask.

A film of silicon-containing material may be deposited by the reactive sputtering method using a target such as a silicon target, transition metal target or transition metal silicon target, and a sputtering gas including a rare gas (inert gas) such as helium, neon or argon gas, and a reactive gas selected in accordance with the desired composition of a film to be deposited from among oxygen-containing gas, nitrogen-containing gas and carbon-containing gas.

The exposure light to which the photomask blank, specifically photomask is subjected (that is, light used for exposure through a photomask) is preferably light of wavelength up to 250 nm, especially up to 200 nm, typically ArF excimer laser light (wavelength 193 nm) or $F_2$ laser light (157 nm), with the ArF excimer laser light (wavelength 193 nm) being most preferred.

The photomask blank is preferably constructed such that overall films inclusive of the light-shielding film which are left on the substrate after the completion of a photomask from the photomask blank may have an optical density (OD) of at least 2.3, preferably at least 2.5, more preferably at least 2.8, and most preferably at least 3.0 with respect to the exposure light. Where the film to be left on the substrate is solely the light-shielding film, the light-shielding film alone should preferably have an OD in the range. Where the film to be left on the substrate includes the light-shielding film and another film such as etching stop film and/or phase shift film, or hard mask film, the overall films should preferably have an OD in the range.

A photomask may be prepared from the photomask blank of the invention by a conventional method. For example, a binary photomask may be prepared through the following steps. The process starts with a photomask blank having a light-shielding film on a transparent substrate. First a resist, typically chemically amplified resist material is coated onto the light-shielding film of the photomask blank. The resist film is exposed imagewise to EB or radiation and developed to form a desired resist pattern. With the resist pattern made etching mask, fluorine base dry etching is performed to pattern the light-shielding film. The resist pattern is removed by a standard technique, yielding a photomask.

Where a hard mask film of chromium-containing material is disposed on the light-shielding film, a resist, typically chemically amplified resist material is coated onto the hard mask film. The resist film is exposed imagewise to EB or radiation and developed to form a desired resist pattern. With the resist pattern made etching mask, chlorine base dry etching is performed to pattern the hard mask film. Then with the hard mask film pattern made etching mask, fluorine base dry etching is performed to pattern the light-shielding film. The resist pattern is removed by a standard technique, yielding a photomask. Notably, the hard mask film pattern is removed if necessary, and if it is removed, then a new resist pattern is optionally formed and later removed by chlorine-base dry etching.

Where an etching stop film of chromium-containing material is disposed below the light-shielding film (between the substrate and the light-shielding film), once the light-shielding film is patterned, an etching stop film pattern may be formed by chlorine base dry etching. At this point of time, the light-shielding film pattern may function as an etching mask.

In the case of a photomask blank having a phase shift film, for example, a photomask blank having a phase shift film of silicon-containing material and a light shielding film formed in sequence on a transparent substrate, a photomask may be prepared therefrom through the following steps. First a resist, typically chemically amplified resist material is coated onto the light-shielding film. The resist film is exposed imagewise to EB or radiation and developed to form a desired resist pattern. With the resist pattern made etching mask, fluorine base dry etching is performed to pattern the light-shielding film and further pattern the phase shift film. If part of the light-shielding film is to be left, then a new resist pattern for protecting the relevant portion is formed on the light-shielding film pattern and thereafter, fluorine base dry etching is performed to remove the portion of the light-shielding film which is not protected with the resist pattern. The resist pattern is removed by a standard technique, yielding a phase shift photomask.

Where an etching stop film of chromium-containing material is disposed between the light-shielding film and the phase shift film, a resist, typically chemically amplified resist material is coated onto the light-shielding film. The resist film is exposed imagewise to EB or radiation and developed to form a desired resist pattern. With the resist pattern made etching mask, fluorine base dry etching is performed to pattern the light-shielding film. Next, with the light-shielding film pattern made etching mask, chlorine base dry etching is performed to pattern the etching stop film, yielding an etching stop film pattern in which a portion of the etching stop film corresponding to the portion of the phase shift film to be removed has been removed. Then the resist pattern is removed. If part of the light-shielding film is to be left, then a new resist pattern for protecting the relevant portion is formed on the light-shielding film pattern. Thereafter, with the etching stop film pattern made etching mask, fluorine base dry etching is performed to pattern the phase shift film and simultaneously remove the portion of the light-shielding film which is not protected with the resist pattern. Then the resist pattern is removed by a standard method. Furthermore, chlorine base dry etching is performed to remove the portion of the etching stop film where the light-shielding film has been removed. If a new resist pattern is formed, the resist pattern is removed by a standard technique, yielding a phase shift photomask.

In the case of a photomask blank having an etching stop film of chromium-containing material between the light-shielding film and the phase shift film and a hard mask film of chromium-containing material on the light-shielding film, first a resist, typically chemically amplified resist material is coated onto the hard mask film. The resist film is exposed imagewise to EB or radiation and developed to form a desired resist pattern. Next, with the resist pattern made etching mask, chlorine base dry etching is performed to pattern the hard mask film. Next, with the hard mask film pattern made etching mask, fluorine base dry etching is performed to pattern the light-shielding film. Next the resist pattern is removed. If only part of the light-shielding film is to be left, a new resist pattern for protecting the relevant portion is formed on the light-shielding film pattern, and with the light-shielding film pattern made etching mask, chlorine base dry etching is performed to pattern the etching stop film and simultaneously remove the portion of the hard mask film which is not protected with the resist pattern. Next, with the etching stop film pattern made etching mask, fluorine base dry etching is performed to pattern the phase shift film and simultaneously remove the portion of the light-shielding film which is not protected with the resist pattern. Then the resist pattern is removed by a standard technique. Furthermore, chlorine base dry etching is performed to remove the portion of the etching stop film where the light-shielding film has been removed and the portion of the hard mask film where the resist pattern has been removed, yielding a phase shift photomask.

EXAMPLE

Experiments and Examples are given below for further illustrating the invention although the invention is not limited thereto. The Si:N ratio is an atomic ratio.

Experiment 1

Figure 3A:
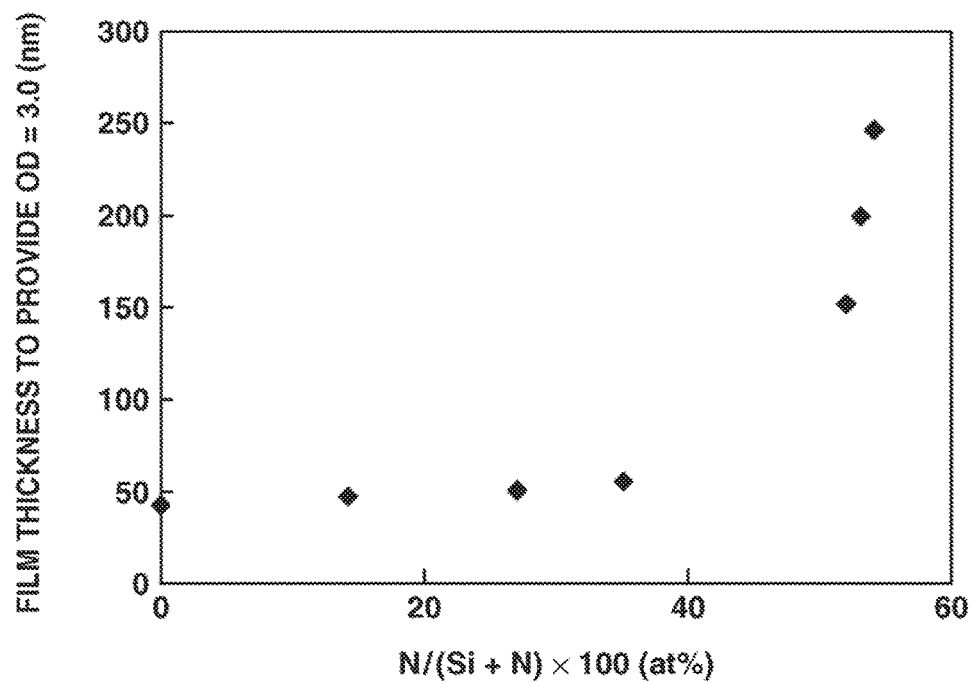
FIG. 3A is a diagram showing the thickness versus composition of films deposited in Experiment.

In a chamber of a sputtering system, a quartz substrate of 152 mm squares and 6.35 mm thick was placed. Sputtering was performed using a silicon target as the sputter target, and argon and nitrogen gases as the sputtering gas. A power of 1.9 kW was applied across the target, argon gas was fed at a flow rate of 15 sccm, and nitrogen gas was fed at a flow rate varying from 0 to 40 sccm into the chamber. There were deposited seven films including a Si film (Si:N=100:0) and SiN films (Si:N=86:14, 73:27, 65:35, 48:52, 47:53, and 46:54). The composition of film was analyzed by XPS (x-ray photoelectron spectroscopy system, Thermo Fisher Scientific Inc., K-Alpha) (same hereinafter). In any case, the film was deposited to such a thickness as to provide an optical density of 3.0 with respect to light of wavelength 193 nm (ArF excimer laser). FIG. 3A shows the relationship of composition to thickness of each film.

Figure 3B:
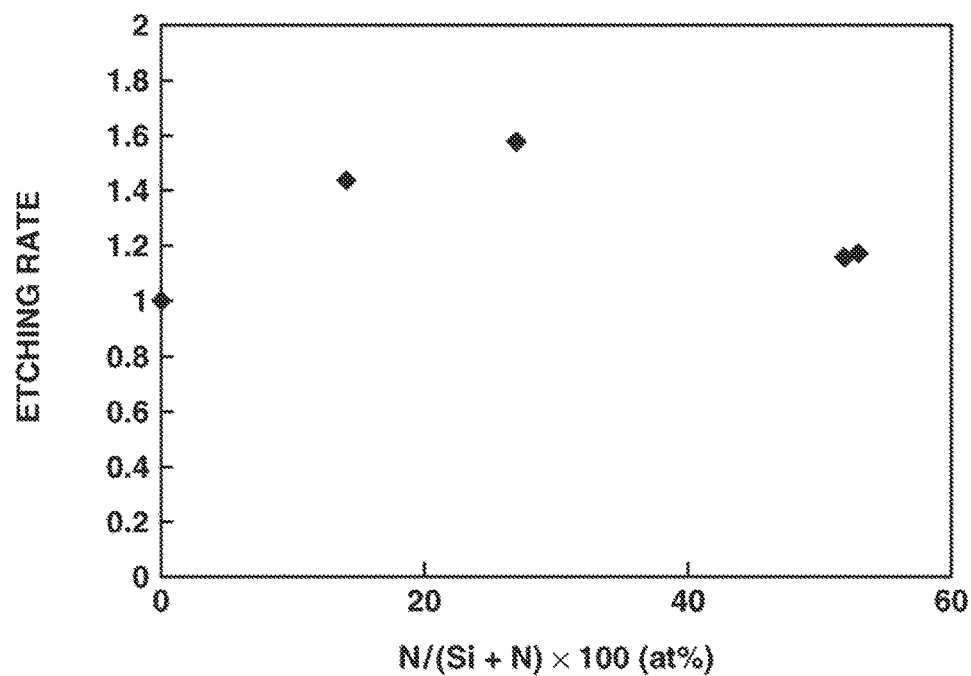
FIG. 3B is a diagram showing the etching rate versus composition of films deposited in Experiment.
Figure 4:
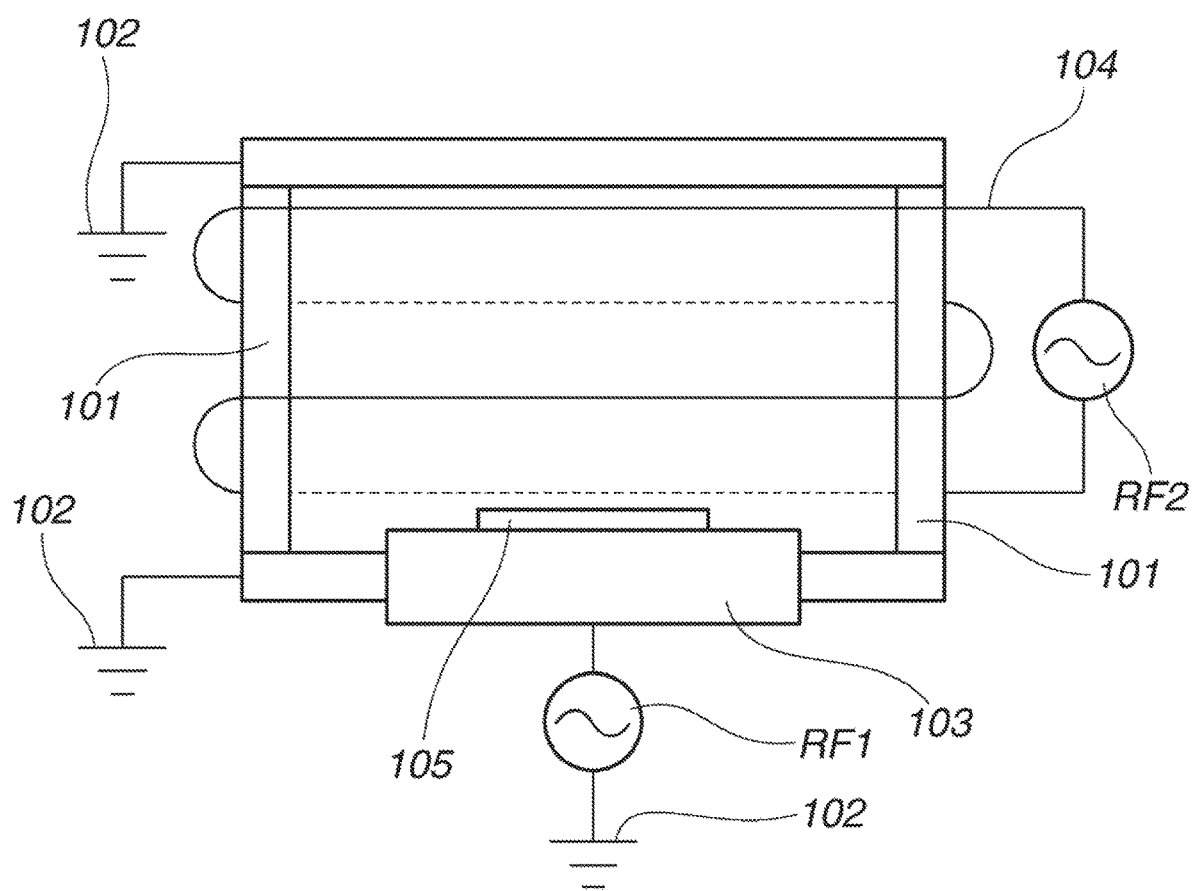
FIG. 4 schematically illustrates a dry etching system used in Experiment.

Next, five films (excluding the films of Si:N=46:54 and 65:35) were etched in an etching system under the following conditions, from which an etching rate was measured. FIG. 3B shows the relationship of composition to etching rate of each film, provided that the etching rate is expressed as a ratio (relative value) thereof to the etching rate of a nitrogen-free Si film. FIG. 4 schematically illustrates the etching system including a chamber 101, a ground 102, a lower electrode 103, an antenna coil 104, a sample 105 to be treated, and radio frequency power supplies RF1 and RF2.

Etching Conditions
RF1: reactive ion etching (RIE)+continuous wave oscillation (CW) 54 W
RF2: inductively coupled plasma (ICP)+continuous wave oscillation (CW) 325 W
Pressure: 5 mTorr
$SF_6$: 18 sccm
$O_2$: 45 sccm Example 1

In a chamber of a sputtering system, a quartz substrate of 152 mm squares and 6.35 mm thick was placed. Sputtering was performed using a silicon target as the sputter target, and argon and nitrogen gases as the sputtering gas. A power of 1.9 kW was applied across the target, argon gas was fed at a flow rate of 15 sccm, and nitrogen gas was fed at a flow rate of 10 sccm into the chamber. A light-shielding layer of 52 nm thick was deposited on the substrate, which served as a light-shielding film. The film had a composition of Si:N=7:3 and an optical density of 3.0. It had a reflectance of 43% at wavelength 193 nm on its top surface.

Next, using a chromium target as the sputter target and nitrogen and argon gases as the sputter gas, sputtering was performed to deposit a hard mask film of CrN having a thickness of 10 nm on the light-shielding film, completing a photomask blank.

Next, the photomask blank was processed into a photomask by coating an EB lithography resist film on the hard mask film, and patterning the resist film to form a resist pattern. With the resist pattern made etching mask, chlorine base dry etching was performed to pattern the hard mask film of CrN to form a hard mask film pattern. With the hard mask film pattern made etching mask, fluorine base dry etching was performed to etch the light-shielding film to form a line-and-space pattern having a line width of 200 nm. The resist pattern and hard mask film pattern were removed, yielding the photomask.

In a clean air atmosphere of temperature 25° C. and humidity 45%, the photomask thus obtained was irradiated with light of wavelength 193 nm having a pulse frequency of 1.6 kHz and a pulse energy of 2.5 to 4.0 mJ/cm$^2$ until the cumulative irradiation energy dose reached 40 kJ/cm$^2$. An exposure system ArFES-3500PM (Litho Tech Japan Corp.) and an ArF excimer laser light source IndyStar (Coherent GmbH) were used. The line width of the light-shielding film pattern before and after irradiation of light of wavelength 193 nm was measured under a scanning electron microscope LWM9045 (Vistec). The pattern size variation before and after irradiation of 193 nm light was as small (or satisfactory) as 1 nm or less.

Example 2

In a chamber of a sputtering system, a quartz substrate of 152 mm squares and 6.35 mm thick was placed. Sputtering was performed using a silicon target as the sputter target, and argon and nitrogen gases as the sputtering gas. A power of 1.9 kW was applied across the target, argon gas was fed at a flow rate of 30 sccm, and nitrogen gas was fed at a flow rate of 10 sccm into the chamber. A light-shielding layer of 44 nm thick was deposited on the substrate. With the flow rate of nitrogen gas changed to 20 sccm, sputtering was continued to deposit a reflectance-reducing layer of 5 nm thick. There was obtained a photomask blank having a light-shielding film (thickness 49 nm) consisting of these layers. In the light-shielding film, the light-shielding layer had a composition of Si:N=7:3 and the reflectance-reducing layer had a composition of Si:N=1.1:0.9. The light-shielding film had an optical density of 3.0 and a reflectance of 35% at wavelength 193 nm on its top surface.

Example 3

In a chamber of a sputtering system, a quartz substrate of 152 mm squares and 6.35 mm thick was placed. Sputtering was performed using a silicon target as the sputter target, and argon and nitrogen gases as the sputtering gas. A power of 1.9 kW was applied across the target, argon gas was fed at a flow rate of 30 sccm, and nitrogen gas was fed at a flow rate of 10 sccm into the chamber. A light-shielding layer of 44 nm thick was deposited on the substrate. While the flow rate of nitrogen gas was slowly increased from 10 sccm to 30 sccm, sputtering was continued to deposit a reflectance-reducing layer of 5 nm thick. There was obtained a photomask blank having a light-shielding film (thickness 49 nm) consisting of these layers. In the light-shielding film, the light-shielding layer had a composition of Si:N=7:3 and the reflectance-reducing layer had a composition which continuously decreased in a thickness direction remote from the substrate, specifically a composition of Si:N=7:3 at the side close to the substrate and Si:N=1:1 at the side remote from the substrate, and an overall average composition of Si:N=6:4. The light-shielding film had an optical density of 3.0 and a reflectance of 36% at wavelength 193 nm on its top surface.

Japanese Patent Application Nos. 2016-040199 and 2016-246173 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A binary photomask blank comprising a transparent substrate and a light-shielding film disposed thereon, containing silicon and nitrogen, but being free of a transition metal, wherein
   said light-shielding film has an optical density (OD) of at least 2.5 with respect to ArF excimer laser,
   said light-shielding film is constructed of a light-shielding layer containing silicon and nitrogen, free of a transition metal, and having a nitrogen content of 3 to 50 at % based on the sum of silicon and nitrogen, and
   one or more of a reflectance-reducing layer containing silicon and nitrogen, free of a transition metal.

2. The binary photomask blank of claim 1 wherein the light-shielding layer consists of silicon and nitrogen.

3. The binary photomask blank of claim 1 wherein the silicon content of the reflectance-reducing layer is lower than the silicon content of the light-shielding layer, and the reflectance-reducing layer has a silicon content of 43 to 60 at % and a nitrogen content of 40 to 57 at %.

4. The binary photomask blank of claim 1 wherein said one or more layers of reflectance-reducing layer have a thickness of up to 10 nm.

5. The binary photomask blank of claim 1 wherein said light-shielding film has a thickness of up to 70 nm.

6. The binary photomask blank of claim 1, further comprising a hard mask film which is disposed contiguous to the surface of said light-shielding film remote from the substrate, and has different etching properties from said light-shielding film.

7. The binary photomask blank of claim 1, further comprising an etching stop film which is disposed contiguous to the surface of said light-shielding film close to the substrate, and has different etching properties from said light-shielding film.

8. A method for preparing a photomask comprising the step of patterning the light shielding film of the binary photomask blank of claim 1.

9. The binary photomask blank of claim 1 wherein the light-shielding layer has a total content of silicon and nitrogen of at least 70 at % based on the layer and a nitrogen content of 3 to 40 at % based on the sum of silicon and nitrogen.

10. The binary photomask blank of claim 1 wherein said light-shielding film is constructed by two layers consisting of the light-shielding layer and the reflectance-reducing layer.

11. A binary photomask blank comprising a transparent substrate and a light-shielding film disposed thereon, containing silicon and nitrogen, but being free of a transition metal, wherein
   said light-shielding film has an optical density (OD) of at least 2.5 with respect to ArF excimer laser,
   said light-shielding film is constructed of a light-shielding layer containing silicon and nitrogen, free of a transition metal, and having a nitrogen content of 3 to 50 at % based on the sum of silicon and nitrogen, and
   a compositionally graded layer containing silicon and nitrogen, free of a transition metal, having a composition continuously graded in thickness direction.

12. The binary photomask blank of claim 11 wherein the compositionally graded layer has a thickness of up to 30 nm.

13. The binary photomask blank of claim 11 wherein the compositionally graded layer is a reflectance-reducing layer which is disposed on the side of the light-shielding layer remote from the substrate and compositionally graded such that the silicon content continuously decreases in a direction remote from the substrate.

14. The binary photomask blank of claim 13 wherein the reflectance-reducing layer has a silicon content of 43 to 60 at % and a nitrogen content of 40 to 57 at % at the surface thereof which is remote from the substrate.

15. The binary photomask blank of claim 11 wherein the light-shielding layer consists of silicon and nitrogen.

16. The binary photomask blank of claim 11 wherein said light-shielding film has a thickness of up to 70 nm.

17. The binary photomask blank of claim 11, further comprising a hard mask film which is disposed contiguous to the surface of said light-shielding film remote from the substrate, and has different etching properties from said light-shielding film.

18. The binary photomask blank of claim 11, further comprising an etching stop film which is disposed contiguous to the surface of said light-shielding film close to the substrate, and has different etching properties from said light-shielding film.

19. The binary photomask blank of claim 11 wherein the light-shielding layer has a total content of silicon and nitrogen of at least 70 at % based on the layer and a nitrogen content of 3 to 40 at % based on the sum of silicon and nitrogen.

20. A method for preparing a photomask comprising the step of patterning the light shielding film of the binary photomask blank of claim 11.

* * * * *